US008770500B2

(12) United States Patent
Mukhopadhyay et al.

(10) Patent No.: US 8,770,500 B2
(45) Date of Patent: Jul. 8, 2014

(54) FREE FLOWING 100-500 MICROMETER SIZE SPHERICAL CRYSTALS OF COMMON SALT AND PROCESS FOR PREPARATION THEREOF

(71) Applicant: Council of Scientific & Industrial Research, New Delhi (IN)

(72) Inventors: Indrajit Mukhopadhyay, Bhavnagar (IN); Pushpito Kumar Ghosh, Bhavnagar (IN); Vadakke Puthoor Mohandas, Bhavnagar (IN)

(73) Assignee: Council of Scientific & Industrial Research, New Delhi (IN)

( * ) Notice: Subject to any disclaimer, the term of this patent is extended or adjusted under 35 U.S.C. 154(b) by 0 days.

(21) Appl. No.: 13/689,468

(22) Filed: Nov. 29, 2012

(65) Prior Publication Data

US 2013/0087642 A1    Apr. 11, 2013

Related U.S. Application Data

(62) Division of application No. 12/205,697, filed on Sep. 5, 2008, now abandoned.

(30) Foreign Application Priority Data

Jan. 7, 2008    (IN) .................................. 60DEL2008

(51) Int. Cl.
*B02C 19/00*    (2006.01)

(52) U.S. Cl.
USPC .............................. 241/21; 241/23; 241/24.1

(58) Field of Classification Search
USPC ............................................ 241/21, 23, 24.1
See application file for complete search history.

(56) References Cited

U.S. PATENT DOCUMENTS

| 625,031 | A | 5/1899 | Hirt |
| 1,593,564 | A | 7/1926 | Boughton |
| 1,932,364 | A | 10/1933 | Martin |
| 2,458,450 | A | 1/1949 | Utermohlen et al. |
| 3,335,016 | A | 8/1967 | Sair et al. |
| 3,567,371 | A | 3/1971 | Birchall |
| 3,632,390 | A | 1/1972 | Bradshaw et al. |
| 3,770,390 | A | 11/1973 | Teot |

(Continued)

FOREIGN PATENT DOCUMENTS

| EP | 0 909 574 A1 | 4/1999 |
| EP | 1 545 733 B9 | 5/2007 |
| GB | 418349 | 10/1934 |
| WO | WO 2004/018068 A1 | 3/2004 |
| WO | WO 2005/066075 A1 | 7/2005 |
| WO | WO 2006/045795 | 5/2006 |

OTHER PUBLICATIONS

Kaneko et al., "Effect of Supersaturation on Crystal Size and Number of Crystals Produced in Antisolvent Crystallization", *Journal of Chemical Engineering of Japan* 35(11):1219-1223, 2002.

(Continued)

*Primary Examiner* — Mark Rosenbaum
(74) *Attorney, Agent, or Firm* — DLA Piper LLP (US)

(57) ABSTRACT

The present invention provides spherical shaped crystals of common salt having size distribution in the range of 100-500 μm and a process for preparation of the said salt. The above mentioned size range is relevant for many important edible and non-edible applications of salt. The salt is demonstrated to have superior flow properties compared to the cubic counterpart. The free flow property of the salt can be further enhanced through surface treatment with additive such as glycine. The salt is produced by cost-effective mechanical means and such production is amenable to scale up.

11 Claims, 8 Drawing Sheets

(56) References Cited

U.S. PATENT DOCUMENTS

| | | |
|---|---|---|
| 3,856,922 A | 12/1974 | Bragdon |
| 4,263,011 A | 4/1981 | Huguenard et al. |
| 5,021,079 A | 6/1991 | Nakane |
| 6,264,989 B1 | 7/2001 | Kato et al. |
| 6,478,828 B1 | 11/2002 | Ninane et al. |
| 6,620,351 B2 | 9/2003 | Gupta et al. |
| 7,220,435 B2 | 5/2007 | Dastidar et al. |
| 2005/0206022 A1 | 9/2005 | Pellikaan et al. |

OTHER PUBLICATIONS

Reverchon, "Supercritical-Assisted Atomization to Produce Micro- and/or Nanoparticles of Controlled Size and Distribution", *Ind. Eng. Chem. Res.* 41:2405-2411, 2002.

Smit, "The Effect of Filler Size and Geometry on the Flow of Carbon Black Filled Rubber", *Rheologica Acta, Band 8, Heft 3*, pp. 277-287, 1969.

Zijlema et al., "Crystallization of Sodium Chloride with Amines as Antisolvents", *ACS Symposium Series*, vol. 667, Abstract, 1997.

Length scale in mm and angles are in degree

Length scale in mm and angles are in degrees

FREE FLOWING 100-500 MICROMETER SIZE SPHERICAL CRYSTALS OF COMMON SALT AND PROCESS FOR PREPARATION THEREOF

CROSS REFERENCE TO RELATED APPLICATIONS

This application is a divisional of U.S. application Ser. No. 12/205,697, filed Sep. 5, 2008, which claims the benefit under 35 USC §119(a) of India Application No. 60/DEL/2008 filed Jan. 7, 2008. The disclosure of each of the prior applications is considered part of, and is incorporated by reference in, the disclosure of this application.

BACKGROUND OF THE INVENTION

1. Field of the Invention

The present invention relates to spherical shaped crystals of salt obtained from saturated brine useful for edible and non-edible applications.

More particularly, the present invention relates to spherical shaped crystals of salt having size in the range of 100-500 μm obtained from saturated brine without using any habit modifier.

The present invention further relates to a process of preparation of spherical shaped crystals of salt having size in the range of 100-500 μm obtained from saturated brine without using any habit modifier.

2. Background Information

Common salt or sodium chloride or NaCl, apart from being an essential dietary component, is a basic raw material for the manufacture of a wide variety of industrial chemicals viz. sodium carbonate (soda ash), sodium hydroxide (caustic soda), and chlorine. Besides, salt is used in textile, dairy, dyeing, food, fertilizer, leather, paper and pharmaceutical industries. The flow properties of salt are important in many applications that entail use of granular salt.

Reference may be made to the article "What is a Granular Medium?" by Granular Volcano Group (world-wide web at address granular-volcano-group.org; and granular.org), wherein it is stated that the concentrated flow of granular substances can be studied by measuring the angle of repose (or angle of internal friction). It is stated therein that the angle of repose is typically in the range of 15 o to 50 o and that the angle is low when grains are smooth, coarse or rounded, and, it is high for sticky, sharp, irregular, or very fine particles.

Reference may also be made to the paper "The effect of filler size and geometry on the flow of carbon black filled rubber" by P. P. A. Smit (Rheologica Acta, Volume 8, Number 3/August, 1969).

Reference may be made to any standard text book in the area of solid state chemistry or physics wherein it is mentioned that common salt crystallizes with cubic morphology.

Reference may be made to the well known prior art wherein in many solar salt pans nearly round-shaped salt can be seen at the edges of the crystallizers. However, these salt granules are very large, measuring 2-4 mm which would make it unsuitable for many applications.

Reference may be made to the paper by R. J. Davey et al. (J. Cryst. Growth, 1991, vol. 114, pp. 7-12) in which the structures of different types of salt crystals are described. A figure is also shown of granular NaCl with 1 mm size. Neither is the process of preparation disclosed nor is any mention made of spherical salt of the size range of the present invention.

Reference may be made to the Japanese Patent No: JP63162526A2 wherein a process of producing spherical salt is depicted. In the said process conventional salt crystals having dimension of 0.5-0.8 mm are subjected to centrifugal force. A binding agent is then added followed by spraying of fine salt particles passing through 250 mesh (i.e., about 70-80 micron) to yield spherical salt. The main problem with the process is that the resultant particles of spherical granular salt would be bigger than the size of the nucleus taken which itself is rather big. Another problem is that the round salt cannot be directly obtained from brine but only from further processing of pre-formed salt. Moreover, the process requires use of a very fine salt powder to coat over the initial salt nucleus and making such fine salt has its own associated problems.

Reference may be made to the European Patent No: EP 1,545,733,B9 (WO 2004/018068) dated Apr. 21 1999 by Mayer et al. wherein an evaporative salt crystallization process that produces pure salt of octahedral or spherical morphology is disclosed. The process utilized saccharide or its derivative in an evaporative process occurring at room temperature. The main disadvantage of the said process is that the saccharide is used in about 5% (w/v) concentration. Such high concentrations of saccharides would (i) lead to unwarranted increase in viscosity of the brine which, in turn, would slow down evaporation, (ii) result in contamination of the salt with saccharide, and (iii) add to cost. Moreover, the process may not be suitable for salt production by forced evaporation at elevated temperatures since the example provided is only for ambient temperature evaporation. No mention is made of the specific sizes of spherical crystals obtained nor is there any quantitative measurement reported of improved flow.

Reference may be made to U.S. Pat. No. 3,567,371 dated Mar. 2, 1971 by Birchall et al. wherein the preparation of a novel form of NaCl crystal is depicted. The crystallization is carried out from saturated sodium chloride solution containing certain additives. The novel form of crystal is formed in the presence of polyvinyl alcohol alone or in association with polyelectrolytes. Although the process produced an interesting form of NaCl, it does not deal with spherical-shaped salt crystals.

Reference may be made to Japanese Patent No: JP 19870003 13145 dated Dec. 12, 1987 wherein sodium chloride having flat tetrahedron-shaped crystal form is produced by treating an aqueous solution of sodium chloride with a specified catalyst. The invention nicely explains the effect of additive on the growth of various planes and hence, the change in habit or morphology of the crystals. No mention is made of any attempt to produce spherical morphology of salt crystals.

Reference may be made to the preparation of spherical sodium chloride having 6-50 nm (world-wide web at address seas.harvard.edu/environmental-chemistry/projects/aerosolsub3.php) size. Although such salt is useful for fundamental studies, it is not of much use in conventional dietary and industrial applications. Besides, its production in bulk quantity is difficult and costly.

Reference may be made to the Japanese Patent No: JP09086923A2 where in particles of sodium chloride and/or potassium chloride are brought into contact in suspended state with the flame of a burner or a hot (≥800° C. and preferably 1000-1300° C.) gas, to effect the partial melting of the salt particle followed by its cooling. The particle of the salt solidified by cooling is a glassy single particle having nearly true spherical form and particle diameter of 0.01-1.0 mm. The main disadvantage of the process is that the process cannot be considered as practical or cost-effective for bulk production of spherical salt. Neither is there any mention of the control exercised over the size distribution.

Reference may be made to U.S. Pat. No. 7,220,435 by Dastidar et al. wherein the importance of crystal morphology and means of achieving the same for NaCl are described. The patent further discloses the preparation of NaCl of dodecahedron shape. The process entails use of large concentrations of glycine which acts as a habit modifier. Moreover, the process is not applicable at elevated temperatures and, most importantly, the salt crystals are not spherical in a true sense since a rhombic dodecahedran has 12 flat surfaces which would make it difficult for the salt to roll freely. There is also no mention of the size of crystals obtained.

Reference may also be made to the paper by Ballabh et al. (Cryst. Growth & Des., 2006, Vol. 6 (No. 7), p 1591) which provides scientific insight into habit modification of common salt with glycine and further reports changes in angle of repose achieved by converting cubic salt into rhombic dodecahedron shape. There is only a small improvement in flow characteristics.

Reference may be made to the Japanese Patent No: JP2001213970-A wherein a crystallizer with special type of stirrer is used to produce spherical fine particles. The production of a dispersion liquid containing spherical fine particles has been effected by imparting a shear force to a mixture of fused or softened thermoplastic resin and polysiloxane which is not reactive with the fused or softened thermoplastic resin and does not dissolve the fused or softened thermoplastic resin. Spherical fine particles made from the dispersion are used as a powder moulding material, a sintering forming material, a filler for thermoplastic or thermoset resin, a filler for paint, a filter medium, an absorbent for chromatography columns, a spacer toner for liquid crystals, powdered paint and cosmetics. The method readily provides spherical fine particles of thermoplastic resin with high quality. An independent claim is also included for an apparatus for continuously producing dispersion liquid containing spherical fine particles comprising a container with a stirrer with a high speed shear force, a port for charging thermoplastic resin, an outlet for thermoplastic resin, and a supply port for polysiloxane. The port for charging thermoplastic resin is positioned in the vicinity of the stirrer with high speed shear force. No mention is made of preparation of any inorganic solids through this process.

Reference may be made to U.S. Pat. No. 5,366,514 and other references which deal with preparation of common salt through forced evaporation with or without application of vacuum.

Reference may be made to the U.S. Pat. No. 3,647,396 wherein the inventors have disclosed the recrystallization of sodium chloride in the form of high purity cubic crystals from a sodium chloride source containing calcium sulphate impurity by multi-effect evaporation preceded by treatment of the hot sodium chloride saturated brine by flocculants and settling chloride eliminating the conventional requirement for filtering the hot brine.

Reference may be made to vacuum evaporated commercial table salt available commercially in the Indian market (FIG. 1). The salt crystals are observed to be of cubic shape under the microscope and the size of crystals is in the size range of 200-500 µm.

Reference may be made to any standard text book wherein force-evaporated salt is produced with or without application of vacuum at elevated temperatures and normally under agitation.

Reference may be made to the Japanese Patent No: JP01212213A2 by Takehiko wherein controlling of salt crystallisation is depicted. The process used a cycle where the crystallization is carried out by heating can in which mother liquid is extracted from bottom and returning liquid to can while supplying seed crystal and brine. To stably control the growth rate of a crystal and to improve the operation efficiency by supplying brine in the amount larger than the amount of brine to be heated and evaporated at the lower-limit level of a crystallizer, and stopping the supply of brine at the upper-limit level.

Reference may be made to Hasegawa and Masaoka on the world-wide web at address saltscience.or.jp/kenkyu/jyoseilist/ENGsum/04A6-E.pdf. The authors have discussed the effect of mother liquor composition on sodium chloride crystal quality and the effect of crystal growth rate on the quality of crystals. The authors have further indicated a correlation between crystal size and crystal shape under agitated conditions, wherein salt crystals having size less than 300 micron are cubic, those having size more than 500 micron are spherical while in the range of 300-500 micron "condensation and wear" were observed. The main drawback with the prior art is that no mention is made of process parameters and, more importantly, it precludes the possibility of producing salt with good sphericity when the size is <500 micron, whereas many applications of interest demand salt in this size range.

Reference may be made to the European Patent No: EP 0,909,574, A1 dated Apr. 21, 1999 by R, Moschini et al. where in a method for producing salt grains having size distribution preferably in the range of 100-300 µm has been disclosed. The said process is based on atomization of a supersaturated solution of salt in a chamber where a stream of hot air circulates. The process further claimed that the size of nearly spherical shape salt crystals depends on the atomization process and could be controlled in the desired sire range. Although the process can produce spherical salt with size distribution in the range of 100-300 µm and the product is claimed as having homogeneous characteristics, the method suffers from a great disadvantage of operational complications. The process is also not cost effective.

It would be evident from the above prior art that no practical process is reported thus far for the preparation of spherical sodium chloride in the size range of 200-500 µm even though such size range of salt is evidently important in day-to-day products such as vacuum evaporated salt.

Reference may be made to the research article by Zijlema et al. (separation and purification by crystallization ACS symposium series 667: 230-241 1997) wherein the suitability of the amines, diisopropylamine (DiPA) and dimethylisopropylamine, (DMiPA) as anti-solvents for the crystallization of sodium chloride from its aqueous solution has been demonstrated. Continuous crystallization experiments were carried out at temperatures below the liquid-liquid equilibrium line in the single liquid phase area. The product consisted of cubic agglomerated NaCl crystals with maximum primary particle sizes of 10-70 µm.

Reference may be made to U.S. Pat. No. 3,770,390 dated Nov. 6, 1973 by Toet et al. wherein an improved method for the crystallization of water soluble inorganic salts is disclosed. The method utilised monovalent salt of polymeric sulphonate or sulphate additive. The resulting crystals are larger and more regularly shaped. The main problem of the method is that it does not deal with spherical shape of the resulting product. Moreover, the crystals are more than millimetre in size.

Reference may be made to the US Patent No: 2005/0206022A1 by Pelikann et al. wherein the authors depicted a process for the preparation of small particles through precipitation. The patent further disclosed the use of non gaseous anti solvent for the preparation of small particles from a saturated solution of the solute which is to be precipitated. Particles having size distribution in the range of 0.1-80 μm, and generally with cubic morphology, are reported.

Reference may be made to the U.S. Pat. No. 6,621,355 B2 dated Sep. 16, 2003 by Gupta et al. where in a novel way to produce very small particles in the nanometer range, having a narrow size distribution have been disclosed. The process of generation of nano-particles can be extended to a wide variety of materials. The said process used a supercritical fluid as an anti-solvent. Additionally, the dispersion jet generated from the solution containing supercritical anti-solvent is deflected by a vibrating surface that atomises the jet into micro droplets. The main advantage of the prior art is the ability to produce particles in nano-meter dimension with very narrow side distribution as a result of uniform droplet atomization. Also the prior art has an edge over other similar processes in that it can control the size of the particle by changing the vibration intensity of the deflecting surface. However, the main disadvantage of the prior art is the requirement of very high frequency vibration for atomization. Also the particle size distribution varies in the range of nanometer to few micrometer, which may have special application but not of the kind envisaged in the present invention.

Reference may be made to the U.S. Pat. No. 4,263,011 dated Apr. 21, 1981 by Huguenard et al. where in a process of producing fine crystals having improved homogeneity and narrow particle size distribution is disclosed. The crystallization in the said process has been carried out by introducing a solution of a crystallisable solute in a solvent into a bed of small inert continuously moving solid particles and initiating crystallization in the solution while it is in contact with the solid moving bed. The process of the prior art is useful for preparation of morphologically homogeneous inorganic materials with narrow size distribution. The process does not deal with the preparation of spherical shape crystals and also involves several complicated steps.

Reference may be made to the Oslo crystallizer which is a well-known apparatus for the crystallization of inorganic substances, including NaCl, as described in British Chemical Engineering, Vol. 16, pp 681-685, 1971 and British Patent GB-A-418,349. This known apparatus comprises a vertical cylindrical vessel and a vertical tube which is arranged axially in the vessel and which opens in the immediate vicinity of the bottom of the latter; a vertical annular chamber is thus defined between the axial tube and the cylindrical wall of the vessel. In making use of this known apparatus, a bed of crystals is employed in the annular chamber, through which passes a solution supersaturated with the substance which it is desired to crystallize, which substance includes NaCl. This solution is introduced into the apparatus via the axial tube, so that it enters the annular chamber radially, near the bottom of the latter, and subjects the crystals in the bed to a general rotation comprising an upward translation along the wall of the vessel and a downward translation along the axial tube. A great advantage of the above said process in crystallizers, where intensive production of large quantity of granular solids from supersaturated liquid is sought for, is to allow the growth of granular solid individually from supersaturated liquid without causing cake formation. There is no mention of preparation of spherical salt having the size range of 200-500 μm.

Reference may be made to the U.S. Pat. No. 6,478,828 B1 dated Nov. 12, 2002 by Léon Ningana et al. wherein a process is depicted for the crystallization of inorganic salt from supersaturated solution. The process used a bed of crystals which is fluidized by passing the supersaturated solution of the inorganic solute through a distributor which is arranged below the bed of crystals and maintained at a suitable temperature. The bed of crystals in the prior art acts as seeds for the crystallization of the inorganic material. The said process in the invention allows the inorganic substance to crystallize in the form of uniform particles of nearly spherical shape which are generally monolithic spherical beads and having size in the range of 3-30 mm. The main drawback in the context of the present invention is that crystals of smaller size are not obtained through this process.

Reference may be made to the paper by R. Reverchon (Ind. Engg. Chem. Res. Vol. 41, pp 2405-2411, 2002) wherein supercritical CO2-assisted atomization technique has been disclosed to produce micro and nano particles of solid with controlled size. The process is based on the solubilization of controlled quantity of supercritical CO2 in liquid solutions containing a solid solute and subsequent atomization of the ternary solution through a nozzle. The process is reported to be versatile and can be used for any kind of solid using various types of solvents. The said process can produce solid particles in the size range of 0.1-3 μm.

Reference may be made to the paper by S. Kaneko et al. (J. Chem. Engg. Japan Vol. 35, pp. 1219-1223, 2002) wherein effect of ethanol as an anti-solvent on the crystallization of NaCl have been reported. It is shown that addition of ethanol enhances the local supersaturation greatly. The authors have proposed a new method to diminish the high local supersaturation by using very high concentration of ethanol. The said process is reported to yield unagglomerated and monodispersed crystals at an optimum antisolvent concentration. Is has been further shown that nucleation induced by anti-solvent addition occurred by the change in the local supersaturation at the boundary of the starting and feed solution. A correlation between the number of crystals and local supersaturation created by the anti solvent is described. Only cubic salt particles are reported.

Reference may be made to the paper by A. Mersmann et al. (Chem. Engg. Tech., CET Vol 12, pp 137-146, 2004) wherein secondary nucleation in industrial crystallizers is shown to depend on both supersaturation and mechanical stress by stirring. Most models which consider mechanical stress assume that nucleation is proportional to the energy transferred to the crystals during collisions. This is not based on any physical relationship and, in addition, the models do not satisfactorily reproduce the experimental results. Own model, based on the theory of Hertz/Huber, which accounts for the stress of the crystals caused by impact, gave better results. This well-known and proven theory allows the calculation of the volume abraded during collisions between crystals and stirrer or walls. Introducing a nucleate efficiency, the effect of mechanical stress on the rate of secondary nucleation, due to stirring intensity and crystallizer size, can be determined.

Reference may be made to the European Patent No. WO 2006/045795 dated May 4, 2006 by Bargeman et al. wherein a process for the crystallization of salt using antisolvent is disclosed. The proposed process is claimed to work in a close loop to produce salt crystals as well as pure drinkable water through nano-filtration. The effect of the presence of crystal growth inhibitor and anti solvent is also disclosed.

Reference may be made to the U.S. Pat. No. 625,031 dated May 16, 1899 by L. Hirt wherein a new crystallizer and more particularly an apparatus for crystallizing sugar from its mother liquor is disclosed. The apparatus is claimed to have the capability of crystallizing out all the substances those are present in the mother liquor from where sugar is crystallized out. Further, the apparatus is specifically good for the crystallization of saccharine. However, the apparatus does not say anything about the morphology modification of the resulting crystals.

Reference may be made to the U.S. Pat. No. 1,932,364 B1 dated Oct. 24, 1933 by Otto V. Martin wherein an apparatus for the preparation of anhydrous metallic chlorides such as $CaCl_2$ or $MgCl_2$ and the like is disclosed. There is no mention of the morphology of particles obtained.

Reference may be made to the U.S. Pat. No. 2,458,450 dated Jan. 4, 1949 by J. W. Stafford wherein a new crystallizer and more specifically an apparatus for completing the growth of sugar crystals in its mother liquor and a provision for reheating the mother liquor is disclosed. The crystallizer helps to uniform growth of the sugar crystals by ensuring uniform heat exchange with continual motion of the mother liquor in a direction to minimise its exhaustion effect on the crystal growth. The process, however, does not reveal any information on the morphology of the resulting sugar crystals.

Reference may be made to the U.S. Pat. No. 1,593,564 dated Jul. 20, 1975 by R. Lafay et al. wherein a process for selectively crystallizing one of the constituents of a liquid mixture of at least two components is disclosed. The process carried out by cooling down the mixture by direct thermal exchange with an immiscible liquid coolant. The formation of the crystals of the crystallisable component takes place in the stirring zone whereas the partial separation of the crystals takes place in the quiet zone. The main disadvantage of the process is that it does not say anything about the morphology of the resulting crystals.

It will be evident from the prior art that although antisolvent effects have been utilized to produce particles of very small size, there is no mention of use of this approach for producing spherical salt from brine with the larger proportion of crystallized salt having size range of 200-500 micron.

OBJECTS OF THE INVENTION

The main object of the present invention is to provide common salt crystals of spherical morphology from brine in the size range of 100-500 micron which is important for many applications.

Another object of the present invention is to provide a process of preparation of said common salt crystals of spherical morphology without use of any habit modifier.

Another object is to produce such salt under forced evaporation conditions, more particularly at 58±2° C., in an open vessel equipped with a suitable agitator.

Yet another object is to maximise the yield of salt of desired size distribution by increasing the number of nuclei through use of an anti-solvent.

Still another object is to centrifuge the salt slurry accompanied by simultaneous spray washing with pure saturated brine to eliminate impurity ions which may be present in brine.

Yet another object is to dry the wet salt in a manner so as to minimize caking and damage during de-agglomeration.

Still another object is to subject the spherical salt product to sieving to obtain desired size fraction of spherical salt without damaging the surface of the salt.

Further another object is to show that that spherical salt has superior flow when compared to the cubic counterpart.

Still another object is to further enhance the free flow nature of the spherical salt and to retain such free flow characteristic through surface treatment with a food compatible additive which exhibits strong binding to salt and imparts some degree of hydrophobicity.

SUMMARY OF THE INVENTION

The present invention relates to the modification of cubic morphology of common salt to nearly spherical shape. Crystals develop their unique shapes due to the manner in which growth occurs along different crystallographic planes. When crystal habit modifiers are used, they block the growth along certain planes and thereby alter shape. On the other hand, to make a crystal spherical in shape one must ensure that there is no preferential growth along any plane. In the course of the present invention it is found that by suitably controlling the manner of stirring and the rate of evaporation of brine under controlled temperature conditions, salt crystals which are predominantly spherical, and wherein at least 50% of the crystals have size distribution in the range of 100-500 micron, are obtained. The yield of salt having the above size range can be enhanced by introducing an anti-solvent into the saturated brine at the evaporation temperature to induce formation of large number of nuclei. It is further shown that even when spherical salt crystals are produced on evaporation, the wet cake after centrifugation remains vulnerable to agglomeration during drying operations in the oven at temperatures ≥60° C. whereas a near free-flow state is maintained when drying is carried out in the open air or at temperatures ≤40° C. in a conventional or solar oven. Since salt crystals span a broad size range, the required size distribution of spherical salt is achieved through sieving using suitable wire mesh sieves. The dried and sieved spherical salt is shown to have intrinsically superior flow with an angle of repose of 20.2° compared to angle of repose of 28.4° of cubic salt of similar size distribution prepared in similar manner without application of stirring. It is further shown that the angle of repose of spherical salt can be reduced to 17.6° by treating the wet centrifuged cake with 4% glycine (w/v) in saturated brine. Even though the latter salt is vulnerable to caking, the cake can be easily disintegrated while retaining the spherical morphology.

Accordingly, the present invention provides spherical shaped crystals of salt having size in the range of 100-500 µm obtained from saturated brine without using any habit modifier.

In an embodiment of the present invention, the salt exhibits improved flow characteristics having an angle of repose in the range of 19.5°-20.5° without use of additives, with moisture content ranging between 0.3-0.5% (w/w).

In another embodiment of the present invention, the salt exhibits improved flow characteristics having an angle of repose in the range of 17°-18° by giving surface treatment with glycine which binds to salt crystals as reported in the prior art with moisture content ranging between 0.3-0.5% (w/w).

Further in another embodiment of the present invention, a process of preparing free flowing spherical shaped crystals of common salt without using any habit modifier, comprising the steps of:
  (a) charging saturated brine and optionally along with an anti-solvent into thermally insulated stainless steel vessel fitted with heating tape on the external wall of the vessel and with a mechanical stirrer with a stirring rate ranging between 200-275 r.p.m;
  (b) raising the temperature of the brine as obtained from step (a) gradually while stirring up to the pre-set point in the range of 40° C.-80° C.,
  (c) holding the temperature of the brine as obtained from step (b) at temperature of 58±2° C. and allowing the brine to evaporate under mechanical stirring at speed of 220±10 r.p.m;
  (d) discharging the salt slurry as obtained from step (c) from the bottom when the pre-set point of evaporation is being reached and the brine volume being reduced to 25-35% (v/v) of the initial volume taken;

(e) charging the slurry as obtained from step (d) into a centrifuge followed by washing the charged slurry with a spray of saturated solution of sodium chloride;
(f) charging the wet salt as obtained from step (e) in a shallow stainless steel tray, followed by drying in the open sun to reduce the moisture content up to 0.5% (w/w) while minimizing agglomeration;
(g) sieving the dry salt as obtained from step (f) through progressively finer sieves ranging between 35-60 mesh size to fractionate the salt crystals so as to attain the desired size distribution;
(h) recycling the residual glycine solution in the subsequent batches after topping up with additional glycine if required.

In yet another embodiment of the present invention, the anti-solvent used is selected from the group consisting of methanol, ethanol or propanol, more preferably ethanol and being in the concentration ranging between 0.2-0.5% (v/v).

In yet another embodiment of the present invention, the anti-solvent used is for increasing the proportion of the salt crystals having desired size range.

Further in another embodiment of the present invention, the stainless steel vessel used is having a cylindrical geometry with internal diameter of 0.1-1.0 m, height of 0.5-1.0 m for a volume capacity of 100 L.

In still another embodiment of the present invention, the bottom of the stirrer is being placed at a depth of 0.10 m-0.2 m within the said vessel.

In yet another embodiment of the present invention, the mechanical stirrer used is having propeller type of blade having an inclination angle of 10°-20° and blade diameter being in the range of 0.1-0.5 m.

In still another embodiment of the present invention, the stirring rate maintained more preferably in the range of 245-255 r.p.m. and is a critical parameter to obtain the desired morphology of the said crystals.

In yet another embodiment of the present invention, the effective stirring requires a minimum initial free volume in the range of 20-40% to be maintained to ensure proper stirring of the entire volume of brine.

Further in another embodiment of the present invention, the centrifuged product is alternatively dried in a fluidized bed drier or in a forced air oven at 35±5° C. without significant caking.

In still another embodiment of the present invention, the sieving has been performed using 35 mesh size sieves for separating the crystals larger than 500 µm and 45-60 m mesh size sieves for separating fine salt crystals.

In yet another embodiment of the present invention, the product obtained from the said process is packaged in air tight plastic bags for storing for at least up to 3 months.

Further in another embodiment of the present invention, the said crystallized salt is useful as edible salt, more preferably as table salt with or without incorporating micronutrients, additives including free flow agents and also being useful in applications where conventional cubic salt of similar size is normally used.

DETAILED DESCRIPTION OF THE INVENTION

Figure 1:
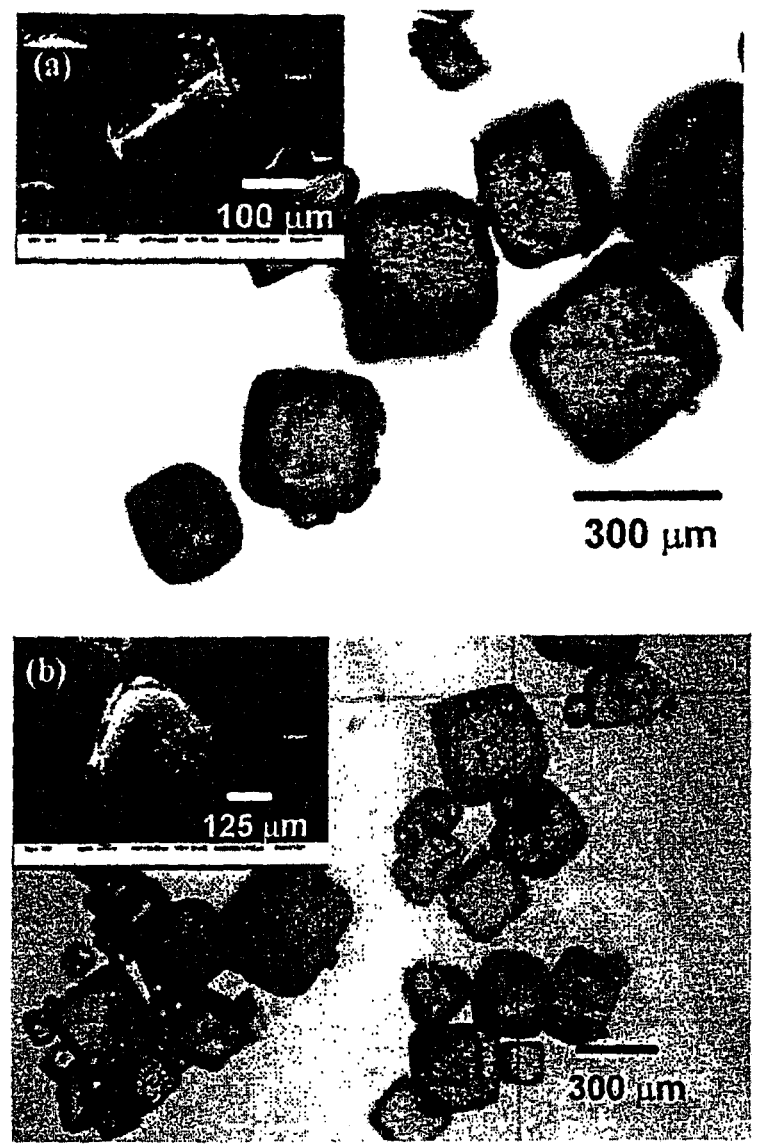
FIG. 1 represents the morphology and size of two top brand vacuum evaporated common table salt [(a) and (b)] available in India.

The shape and size of NaCl crystals can have important bearing on free flow nature, dissolution characteristics and behaviour as filler. The prior art reveals that the shape of the crystals can be controlled both through use of habit modifiers and also through physical means. In the case of habit modification, growth along certain crystallographic planes is blocked and this results in change of morphology. Many different morphologies have been reported through habit modification but the closest to a sphere is the rhombic dodecahedron-shaped salt crystals reported in the recent prior art. Besides the fact that the salt is not truly spherical—and consequently the flow properties are only marginally improved—the size of the crystals tends to be rather large, exceeding 1 mm in the normal practice of the invention. Perfectly spherical crystals, on the other hand, have been realised through a variety of physical and mechanical means, e.g., aerosol formation, atomization, overcoating of salt crystals with fine powders of salt under centrifugal action, mechanical erosion, stirring, etc. The reported sizes of the salt crystals tend to be either too small (<100 micron) or too large (>1000 micron). One recent prior art goes on to suggest that salt crystals can be made spherical if the size is >500 micron whereas they are inevitably cubic for dimensions <300 micron. In the intermediate range "condensation and wear" is observed but there is no clear mention of the specific morphology obtained. It was recognised by the inventors that the very range in which round salt crystals are difficult to obtain is precisely the range that is of interest in many applications of edible and non-edible nature.

It has been found in the course of the present invention that mechanical stirring of saturated brine subjected to forced evaporation can yield different morphologies of salt depending on the interplay of the evaporation temperature and the manner of stirring. For example, keeping all other conditions the same, one can produce either cubic salt or spherical salt by varying the stirring speed. The ideal evaporating temperature, the optimum geometry of the stirrer, the optimum placement of the stirrer in the vessel, and the optimum stirring speed have been identified to produce round salt crystals with ca. 50% (w/w) of the crystals having size distribution in the range of 100-500 micron. By carefully drying the centrifuged wet mass and further by sieving the dried salt, it is possible to isolate the salt crystals having the above size distribution without in any way adversely affecting the morphology and surface smoothness. It was thereafter shown that not only can such salt be produced from pure brine but also from natural brine sources such as sea- and sub-soil brines, i.e., impurities in brine are of no consequence as far as the shaping process is concerned. It is, however, not established yet whether the shaping of the salt occurs during the crystal forming process or whether it occurs subsequent to crystal formation through the process of controlled abrasion.

It was further realised in the course of the invention that by increasing the number of nuclei during the evaporation process, it would be possible to obtain a larger fraction of the salt having the above mentioned size distribution. The knowledge available in the prior art of using ethanol as a food compatible and water miscible anti-solvent was utilised to enhance the number of nuclei by adding an appropriate amount of ethanol into brine prior to commencement of evaporation, resulting in round salt crystals having virtually no crystal that is larger than 500 micron. The small fraction of undersize cubic crystals could be rejected through sieving.

The invention further exploits the affinity of glycine towards the 111 plane of NaCl. However, unlike in the prior art, the glycine is not used to alter the habit of the crystal but merely to alter the wetting properties of the surface. Such surface treatment is achieved by immersing pre-formed spherical salt in a solution of saturated brine containing glycine as additive followed by centrifuging and controlled drying. It is significant that the glycine content of salt is negligibly small.

As part of the overall invention it has been established unambiguously that the free flow property of salt is markedly improved when the morphology is altered from cubic to spherical. It has also been established that glycine treatment further improves the free flow nature of the salt and imparts the salt a greater ability to withstand irreversible caking; caking does occur but the cake is readily disintegrated even with the weakest of impact and no damage is observed either in the morphology or in the surface smoothness.

Inventive steps involved in the present invention include:
recognising that the shape of common salt crystals formed during evaporation of brine can be altered by controlling the manner of agitation during evaporation of brine;
demonstrating that such alteration in shape can be realised not only with pure saturated brine constituted from pure salt but also through evaporation of natural brines, particularly sea brine and sub-soil brine;
identifying the optimum geometry of the crystallizing vessel and the stirrer and also the stirring speed;
identifying the optimum temperature range to produce salt at maximum evaporation rate without sacrificing in any manner the spherical morphology, surface smoothness and desired size distribution range of 100-500 μm;
increasing the proportion of spherical salt of desired size distribution range through use of ethanol anti-solvent to raise the number of nuclei prior to the onset of evaporation;
recognising that the reported utility of glycine as a food-compatible additive which has affinity towards binding to NaCl can be made use of for enhancing the free flow property of spherical salt by reducing vulnerability to irreversible caking;
recognising that agglomeration of spherical salt depends strongly on the temperature of drying and, accordingly, optimising the temperature of drying to minimise agglomeration and, consequently, the need for deagglomeration during which process surface damage can occur;
recognising that the manner of sieving is also critical and optimising the process of sieving;
demonstrating successfully the scale up of the process from 100 g scale per batch to 12 kg scale per batch and thereby instilling confidence that the process may be scaled up further applying known scientific principles;
demonstrating clearly the superior flow property of spherical salt compared to cubic salt of similar size and composition;
demonstrating the enhanced flow of spherical salt resulting from glycine treatment of pre-formed spherical salt.

The following examples are given by way of illustration of the present invention and should not be construed to limit the scope of the present invention.

EXAMPLE 1

150 g of AR grade NaCl (99.9% (w/w) purity) was added to 400 ml of distilled water and the contents were stirred at room temperature for 6 hours. The solution was then filtered to remove excess NaCl and 300 ml of the filtered saturated brine having density of 1.208 gcm$^{-3}$ was kept for crystallization in an open beaker of 1000 ml capacity under ambient conditions in the laboratory. After 80% evaporation of the feed brine, which took several days, the resulting crystals were harvested by centrifugation and dried in an oven at 40° C. for 2 h. Microscopic observation revealed that the crystals were of cubic form as reported in the prior art. The salt was sieved using 35 and 45 mesh size sieves.

EXAMPLE 2

The experiment of Example 1 was repeated except the crystallization was carried out at an elevated temperature of 55° C. The saturated brine was maintained at 55° C. using a thermostated bath. The resulting crystals were examined under optical microscope. The crystals of common salt were once again found to have cubic shape.

EXAMPLE 3

Figure 2:
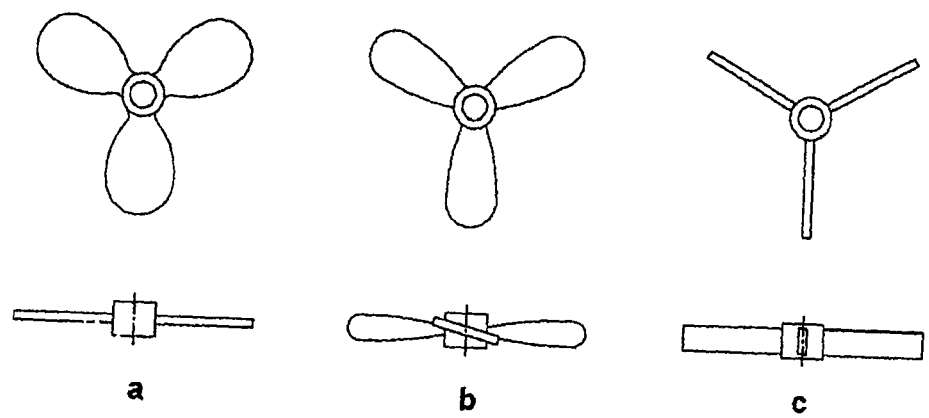
FIG. 2 represents the type of the blades used from the preparation of spherical common salt.

The experiment of Example 2 was repeated with simultaneous stirring of the evaporating brine using three different types of mechanical stirrers (FIG. 2). It was seen that when stirrer speed was maintained constant at 250 rpm, the stirrer with propeller type of blade, FIG. 2(b), under continuous operation, led to the modification of morphology to nearly spherical shape. Stirrer with flat propeller type blade, FIG. 2(a), leads to only partial shaping of the cube edges. Another type of stirrer, shown in FIG. 2(c), only helps to grow cubic sodium chloride. This example teaches us that the stirrer blade design of FIG. 2(b) is most suitable.

EXAMPLE 4

300 ml of filtered saturated brine, prepared as in Example 1, was taken in borosilicate glass beaker of 1000 ml capacity. Crystallization was carried out under continuous stirring using a mechanical stirrer having propeller type blades at room temperature. The rate of stirring was limited to 50 rpm as estimated with a tachometer. When 80% of the total feed brine was evaporated over 2-3 days, the slurry containing the salt crystals was centrifuged and dried in an oven at 40° C. for 2 hours. Optical microscopic studies revealed that the crystals were corner shaped cubic in morphology.

Examples 3 and 4 teach us that the stirrer blade design and the stirring rate are both critically important parameters controlling the shaping of the crystals formed in the course of evaporation.

EXAMPLE 5

Figure 3:
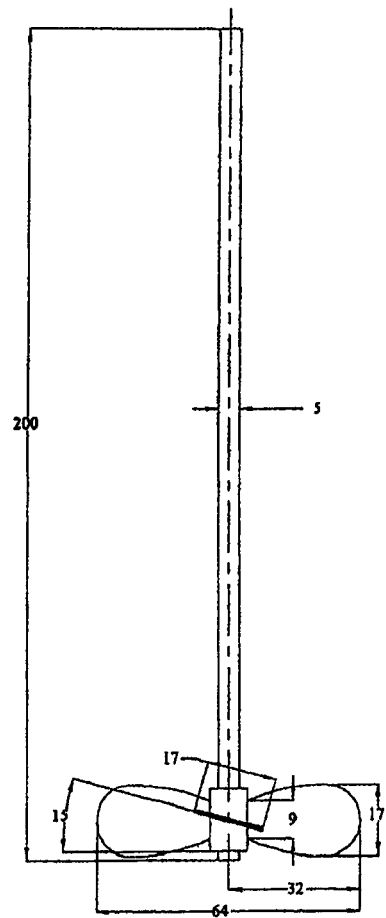
FIG. 3 represents the stirrer used for the preparation of spherical salt crystals in the laboratory as cited in Example 5.
Figure 3:
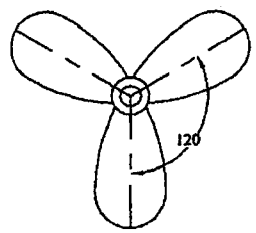

The experiment of Example 3, conducted with 300 ml of saturated brine, was repeated with the stirrer assembly of FIG. 3 and the brine evaporated to 20% of original volume. This took ca. 12 hours. The crystals of NaCl were mainly of nearly spherical shape with broad size distribution in the range of 100 to 1000 micron. The flow properties of the salt crystals were compared qualitatively with that of the salt of Example 2 above and the former were found to be distinctly more free-flowing. The salt also had much lesser tendency to stick to the surface of the plastic container in which it was stored.

EXAMPLE 6

The experiment of Example 5 was repeated varying the temperature of evaporation in the range of 30-80° C. Best results in terms of shape, size distribution of crystals and rate of evaporation were obtained at 55° C. with the optimum stirring condition of Example 3. Higher temperatures led to deviations from sphericity and also larger size of crystals whereas lower temperatures led to slowing down of the evaporation process.

EXAMPLE 7

The experiment of Example 5 was repeated except that the feed brine was saturated sea brine having the composition 250 $gL^{-1}$ NaCl, 0.55 $gL^{-1}$ $Ca^{2+}$, 11.5 $gL^{-1}$ $Mg^{2+}$ and 17 $gL^{-1}$ $SO_4^-$. The resulting salt crystals were found to be of nearly spherical morphology.

EXAMPLE 8

The experiment of Example 5 was repeated except that the feed brine was saturated sub-soil brine having the composition 240 $gL^{-1}$ NaCl, 1.0 $gL^{-1}$ $Ca^{2+}$, 10.5 $gL^{-1}$ $Mg^{2+}$ and 8 $gL^{-1}$ $SO_4^{2-}$ The resulting crystals were of nearly spherical morphology.

EXAMPLE 9

Figure 4:
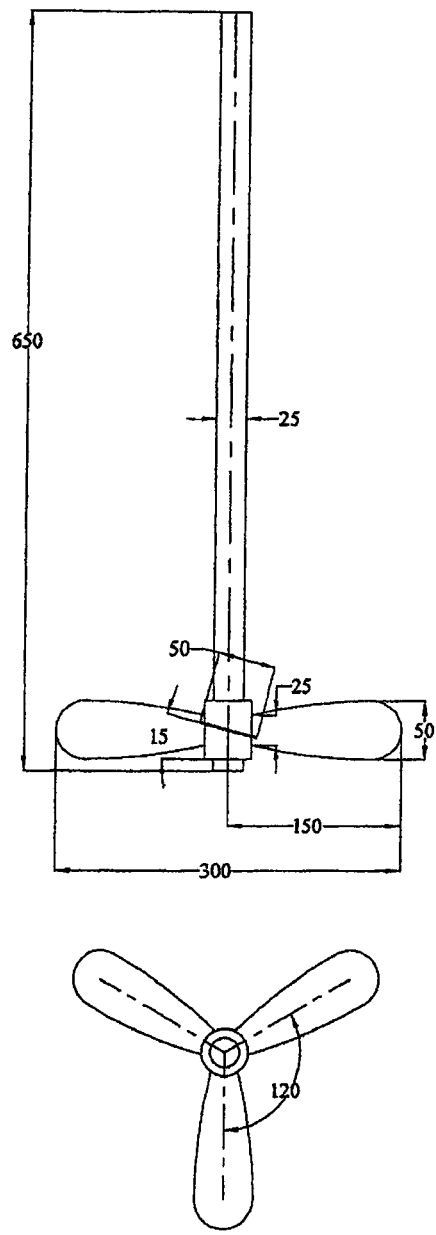
FIG. 4 represents the stirrer used for the preparation of spherical salt crystals on a bench scale as cited in Example 9.
Figure 5:
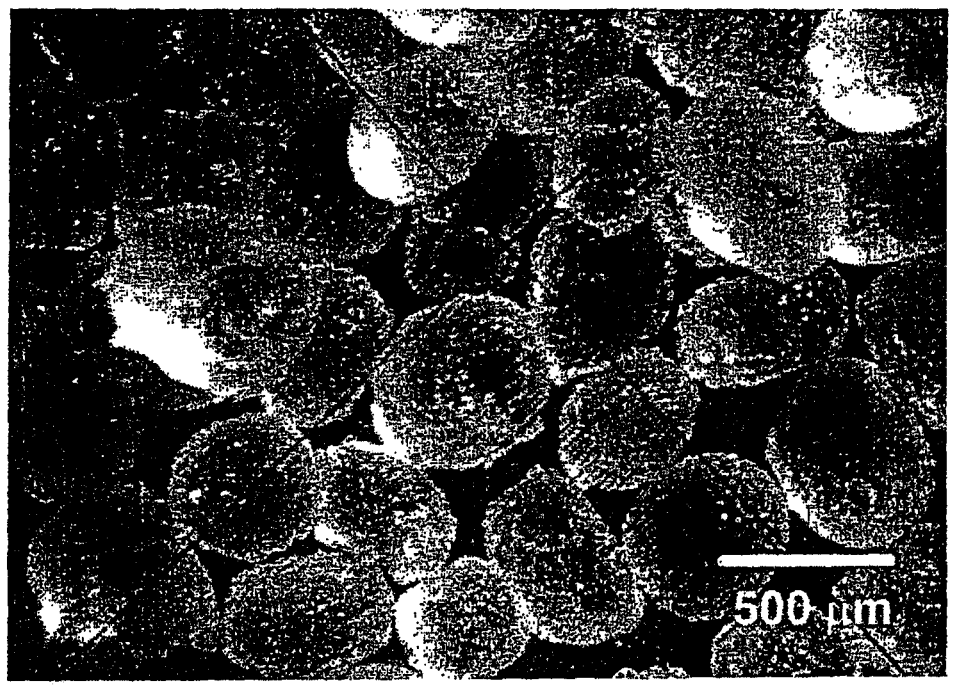
FIG. 5 shows the micrograph of the spherical salt prepared by the process of Example 9.

Crystallization was carried out in a cylindrical crystallizer of 100 L capacity at 55° C. 70 lit. of saturated brine, made by dissolving NaCl of 99.5% purity (dry basis) was fed to the crystallizer. During crystallization continuous mechanical stirring at 210 rpm was carried out using a mechanical stirrer having propeller type blades whose details are shown in FIG. 4. When the volume of brine in the crystallizer reduced to 20 litres, the slurry containing common salt crystals was transferred to a continuous centrifuge. After removal of the adhering brine, the centrifuged product was dried in an electric oven preheated to 60° C. The dried product was found to form cake of the spherical salt crystals. The cakes were disintegrated and sieved trough different mesh to separate crystals of different size. The final product of each size distribution was found to have deformed shape and the surface structure of such crystals was also damaged (FIG. 5).

EXAMPLE 10

The experiment of Example 9 was repeated except that drying of the salt was carried out in the electric oven preset to 40° C. The salt obtained was relatively free of caking and retained the spherical shape. The spherical salt had >99.9% purity (on dry basis), with only traces of $Ca^{2+}$, $Mg^{2+}$ and $SO_4^{2}$. The heavy metal content was below the detection limit of ICP-AES.

EXAMPLE 11

Figure 6:
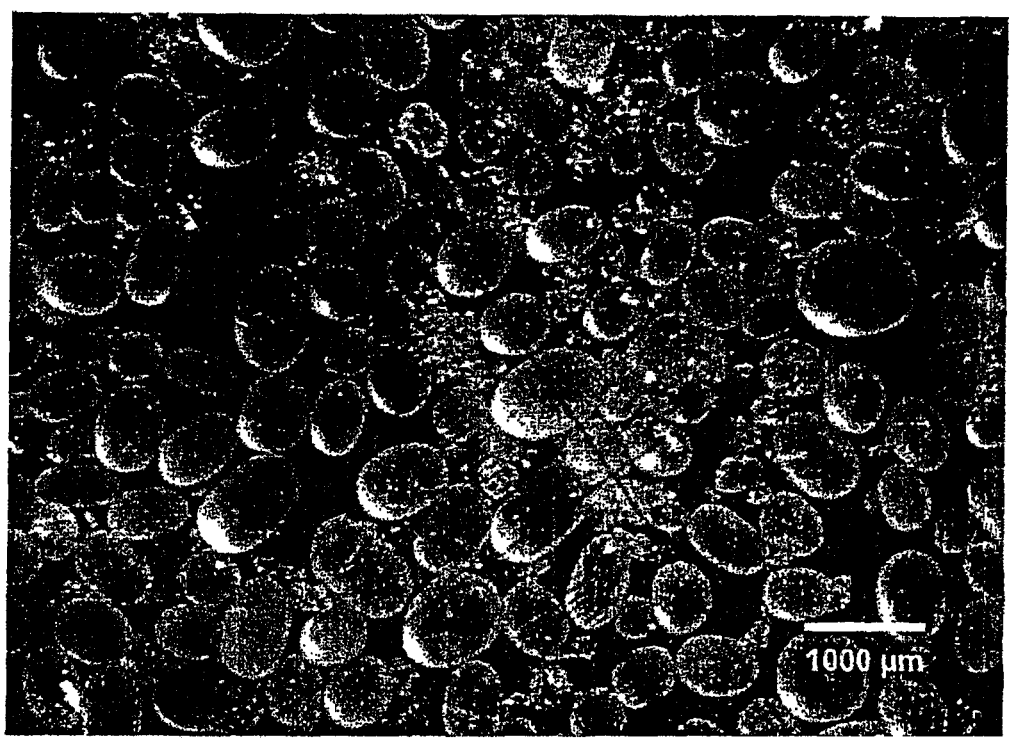
FIG. 6 shows the micrograph of the spherical salt prepared by the process of Example 11.

The experiment of Example 9 was repeated except that drying of the salt was carried out over 4 hours in the open sun (38° C.; R.H. 60%). The salt crystals obtained were once again found to be nearly spherical in morphology with 100-1000 μm size distribution (FIG. 6).

EXAMPLE 12

Figure 7:
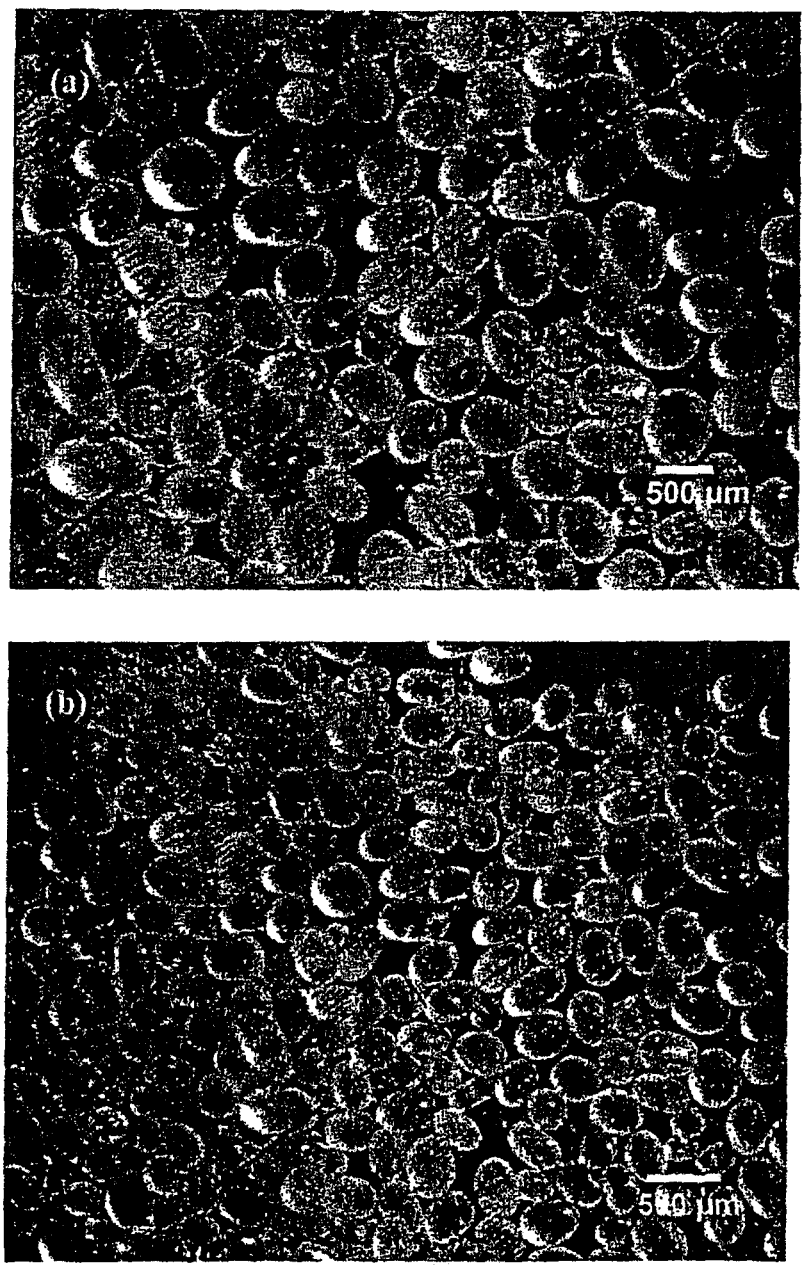
FIG. 7 shows the micrograph of sieved spherical salt fractions derived from the salt of Example 11 following the sieving process of Example 12.

The salt of Example 11 was sieved to obtain salt crystals having narrower size distributions. Spherical salt crystals having sizes in the range of <300 μm, 300-500 μm and 500-1000 μm with respective yields of 0.7 kg, 6.1 kg and 5.5 kg were obtained after successive sieving through 30, 35 and 45 mesh size sieves. The sieved crystals retained their spherical shape with no damage to the surface (FIG. 7).

EXAMPLE 13

The experiment of Example 9 was repeated and the centrifuged salt crystals were immersed in a solution of 4% (w/v) glycine in saturated brine. The immersion time was limited to 2 hours. Afterwards, the salt crystals were centrifuged. The product obtained after centrifugation was dried as per the process of Example 11. The shape of the resulting crystals was spherical. The glycine content of the salt was found to be <0.05% (w/w) by quantitative FT-IR spectroscopy.

EXAMPLE 14

Figure 8:
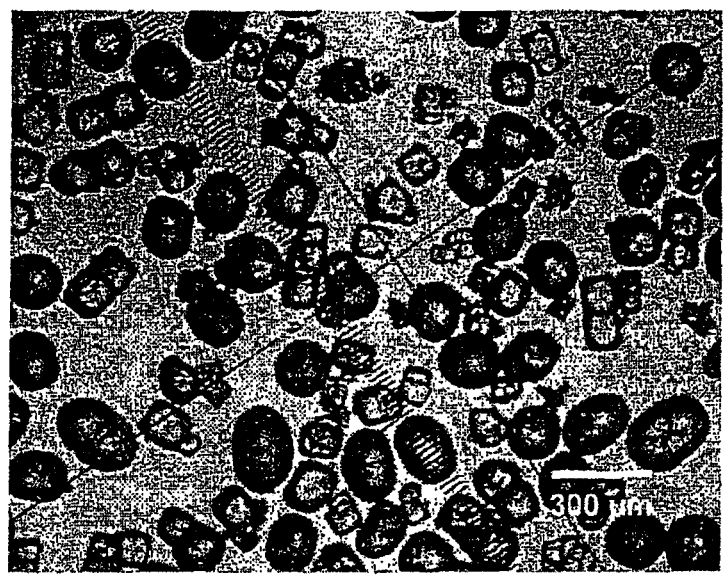
FIG. 8 shows the micrograph of the spherical salt prepared by the process of Example-13.

The crystallization experiment of Example 9 was repeated except that 275 ml of ethanol was added at the onset of crystallization, i.e., when the solution became translucent. The solution turned milky white presumably due to heavy instantaneous nucleation. The majority of salt crystals so obtained after centrifuging and drying as per the process of Example 11 were found to have near spherical shape with size distribution in the range of 100-400 μm (FIG. 8). Increase of ethanol volume from 275 to 400 ml yielded still smaller crystals but these were mainly of deformed cubic shape.

EXAMPLE 15

The free flow nature of the salt samples of Examples 12 and 13, particularly the salt having size distribution in the range of 300-500 μm, was studied and compared with that of cubic salt of similar size distribution. 100 gm of salt samples were collected from each of the experiments of Example 1, Example 12 and Example 13. The natural free flow ability of the salt samples was studied according to the standard method as per the standard procedure e.g., on the world-wide web at address e1.greatlakes.com/content/antec2001.pdf). Three separate piles of the salt samples were made by dropping them from a constant elevation of 10 cm from the base through a glass funnel having an opening of 10 mm. The time of fall was recorded and the angle of repose was measured by standard method as given in the prior art. While cubic salt of Example 1 showed an angle of repose of 24.8°±0.3° the angle of repose of the samples of Examples 12 and 13 were 20.2°±0.3° and 17.6°±0.3°, respectively. This example teaches us that in absence of any additives such as free flow aids, and keeping all other factors such as size distribution and moisture level constant, spherical salt exhibits lower angle of repose than cubic salt which is indicative of its superior flow. The example further teaches us that treatment of such spherical salt with glycine-containing saturated brine enhances the free flow property still further as evident from the further reduction in the angle of repose to values approaching the limiting angle of repose of 15°.

Advantages of the Invention

The advantages of the present invention are as following:
i. Preparation of common salt free flow crystals useful for edible and other industrial purposes;
ii. Relying solely on mechanical means instead of using any habit modifier to realise the desired shape;
iii. Less vulnerable to irreversible caking;
iv. Process as developed is cost-effective and amenable to scale up.

What is claimed is:

1. A process of preparing free flowing spherical shaped crystals of common salt without using any habit modifier, comprising:
    (a) charging saturated brine optionally along with an anti-solvent into a thermally insulated stainless steel vessel fitted with heating tape on the external wall of the vessel and with a mechanical stirrer of appropriate dimension and configurations with a stirring rate ranging between 200-275 r.p.m;
    (b) raising the temperature of the brine as obtained from step (a) gradually while stirring up to the pre-set point in the range of 40° C. - 80° C.,
    (c) holding the temperature of the brine as obtained from step (b) at temperature of 58±2° C. and allowing the brine to evaporate under mechanical stirring at speed of 220±10r.p.m;
    (d) discharging the salt slurry as obtained from step (c) from the bottom when the pre-set point of evaporation is being reached and the brine volume being reduced to 25-35% (v/v) of the initial volume taken;
    (e) charging the slurry as obtained from step (d) into a centrifuge followed by washing the charged slurry with a spray of saturated solution of sodium chloride;
    (f) charging the wet salt as obtained from step (e) in a shallow stainless steel tray, followed by drying in the open sun to reduce the moisture content up to 0.5% (w/w) while minimizing agglomeration;
    (g) sieving the dry salt as obtained from step (f) through progressively finer sieves ranging between 35-60 mesh size to fractionate the salt crystals so as to attain the desired size distribution; and
    (h) recycling the residual glycine solution in the subsequent batches after topping up with additional glycine if required.

2. The process of claim 1, wherein the brine used is selected from the group comprising synthetic brine or natural brines from sea, sub-soil, lake and plant sources.

3. The process of claim 1, wherein the anti-solvent used is selected from the group consisting of methanol, ethanol and propanol in a concentration range of between 0.3-0.5% (v/v).

4. The process of claim 1, wherein the stainless steel vessel used is having a cylindrical geometry with internal diameter of 0.1-1.0 m, height of 0.5-1.0 m for a volume capacity of 100L.

5. The process of claim 1, wherein the bottom of the stirrer is placed at a depth of 0.10 m - 0.2 m within a stainless steel vessel having a cylindrical geometry with internal diameter of 0.1-1.0 m, height of 0.5-1.0 m for a volume capacity of 100 L.

6. The process of claim 1, wherein the mechanical stirrer used is having propeller type of blade having an inclination angle of 10° -20° and blade diameter being in the range of 0.1-0.5 m.

7. The process of claim 1, wherein the stirring rate is maintained in the range of 245-255 r.p.m. and is a critical parameter to obtain the desired morphology of the crystals.

8. The process of claim 1, wherein the effective stirring requires a minimum initial free volume in the range of 20-40% to be maintained to ensure proper stirring of the entire volume of brine.

9. The process of claim 1, wherein the centrifuged product is alternatively dried in a fluidized bed drier or in a forced air oven at 35±5° C. without significant caking.

10. The process of claim 1, wherein the sieving has been performed using 35 mesh size sieves for separating the crystals larger than 500 μm and 45-60 mesh size sieves for separating fine salt crystals.

11. The process of claim 1, wherein the product obtained from the process is packaged in air tight plastic bags for storing for at least up to 3 months.

* * * * *